United States Patent
Purohit et al.

(10) Patent No.: US 12,261,605 B2
(45) Date of Patent: Mar. 25, 2025

(54) GATE DRIVING WITH PHASED SLEW RATE CONTROL AND OVERCURRENT PROTECTION

(71) Applicant: GM Global Technology Operations LLC, Detroit, MI (US)

(72) Inventors: Parth Purohit, Madison, WI (US); Mohamed Ahmed Kamel Ahmed, Birmingham, MI (US); Muhammad Hussain Alvi, Troy, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 195 days.

(21) Appl. No.: 18/154,450

(22) Filed: Jan. 13, 2023

(65) Prior Publication Data
US 2024/0243737 A1    Jul. 18, 2024

(51) Int. Cl.
| | |
|---|---|
| *H02P 27/08* | (2006.01) |
| *H02P 23/14* | (2006.01) |
| *H03K 5/04* | (2006.01) |

(52) U.S. Cl.
CPC ............... *H03K 5/04* (2013.01); *H02P 23/14* (2013.01); *H02P 27/08* (2013.01)

(58) Field of Classification Search
CPC ..... B25J 9/1612; B25J 11/0095; B25J 13/088
See application file for complete search history.

(56) References Cited

U.S. PATENT DOCUMENTS

| | | | | |
|---|---|---|---|---|
| 7,170,324 | B2* | 1/2007 | Huber | H03K 17/163 |
| | | | | 326/82 |
| 7,609,016 | B2* | 10/2009 | Kraus | H02P 7/29 |
| | | | | 318/400.1 |
| 11,031,929 | B1* | 6/2021 | Maier | H03K 17/04206 |
| 2020/0177090 | A1* | 6/2020 | Braz | H02M 1/08 |
| 2021/0063468 | A1* | 3/2021 | Gunasekaran | G01R 31/3277 |

* cited by examiner

*Primary Examiner* — Rina I Duda
(74) *Attorney, Agent, or Firm* — CANTOR COLBURN LLP (57) ABSTRACT

A vehicle, slew rate control circuit and method of operating an electric motor of a vehicle. The slew rate control circuit is between a gate driver of the vehicle and an inverter of the vehicle. The slew rate control circuit includes a first branch between the gate driver and the inverter, wherein the inverter provides an electrical signal output to an electric motor of the vehicle, and a second branch between the gate driver and the inverter in parallel with the first branch, wherein current flows through the first branch during a first time period and through the second branch during a second time period, wherein the flow of the current controls a slew rate of the electrical signal output by the inverter to the electric motor.

20 Claims, 11 Drawing Sheets

GATE DRIVING WITH PHASED SLEW RATE CONTROL AND OVERCURRENT PROTECTION

INTRODUCTION

The subject disclosure relates to operation of an electrical system for a vehicle and, in particular, to a system and method for controlling a slew rate of a voltage at an inverter of the electrical system.

An electrical system for a vehicle includes a power source, an electric motor or machine operating off of the power source, and an inverter for converting a direct current from the power source to alternating current for use at the electric motor. During charging or a turn-on event, the voltage at the machine rises from zero to an operating voltage. When the operating voltage is a high voltage, the voltage rises quickly and can thus overshoot the operating voltage, causing electrical stress on the inverter. Accordingly, it is desirable to provide a method for reducing an amount of overshoot during a high voltage switching.

SUMMARY

In one exemplary embodiment, a method of operating an electric motor of a vehicle is disclosed. A flow of a current between a gate driver and an inverter is controlled by flowing the current through a first branch between the inverter and the gate driver during a first time period and through a second branch between the inverter and the gate driver during a second time period, wherein the flow of the current controls a slew rate of an electrical signal output by the inverter. The electrical signal output is provided by the inverter to the electric motor to operate the electric motor.

In addition to one or more of the features described herein, in an embodiment in which the inverter includes a transistor having a gate, a source and a drain, the method further includes controlling the flow of the current between the gate of the transistor and the gate driver, and wherein the electrical signal output by the inverter is related to a drain-source voltage of the transistor. The method further includes controlling an operation of the gate driver based on a comparison of the drain-source voltage to a threshold voltage. In an embodiment in which first branch includes a capacitor, flowing the current in the first branch during the first time period charges the capacitor in the first branch and discharge of the capacitor during the second time period diverts the current from the first branch to flow in the second branch during the second time period. The method further discharging the capacitor through a capacitor discharge path during the second time period. The first branch includes at least one of a capacitor, a variable capacitor, a variable resistor, and a plurality of capacitors configured to be selectively included into the first branch. In an embodiment in which the first branch includes the plurality of capacitors, the method further includes selecting the capacitance of the plurality of capacitors based on at least one of a vehicle torque, a vehicle speed, and a battery voltage operating point.

In another exemplary embodiment, a slew rate control circuit for controlling an electric motor of a vehicle is disclosed. The slew rate control circuit includes a first branch between a gate driver and an inverter, wherein the inverter provides an electrical signal output to the electric motor, and a second branch between the gate driver and the inverter in parallel with the first branch, wherein current flows through the first branch during a first time period and through the second branch during a second time period, and the flow of the current controls a slew rate of the electrical signal output by the inverter to the electric motor.

In addition to one or more of the features described herein, the inverter includes a transistor having a gate, a source and a drain, the first branch is between the gate of the transistor and the gate driver, and the second branch is between the gate of the transistor and the gate driver, and wherein the electrical signal output by the inverter is related to a drain-source voltage of the transistor. The slew rate control circuit further includes a comparator for comparing the drain-source voltage to a threshold voltage and controlling an operation of the gate driver based on a comparison. In an embodiment, the first branch includes a capacitor, wherein current flowing in the first branch during the first time period charges the capacitor and wherein discharge of the capacitor during the second time period diverts the current from the first branch to flow in the second branch during the second time period. The slew rate control circuit further includes a capacitor discharge path for discharging the capacitor during the second time period. In an embodiment, the first branch includes at least one of a capacitor, a variable capacitor, a variable resistor, and a plurality of capacitors configured to be selectively included into the first branch. The electrical signal output by the inverter is one of a rising voltage pulse and a falling voltage pulse.

In yet another exemplary embodiment, a vehicle is disclosed. The vehicle includes a gate driver, an inverter, and a slew rate control circuit between the gate driver and the inverter. The slew rate control circuit includes a first branch between the gate driver and the inverter, wherein the inverter provides an electrical signal output to an electric motor of the vehicle, and a second branch between the gate driver and the inverter in parallel with the first branch, wherein current flows through the first branch during a first time period and through the second branch during a second time period, wherein the flow of the current controls a slew rate of the electrical signal output by the inverter to the electric motor.

In addition to one or more of the features described herein, the inverter includes a transistor having a gate, a source and a drain, the first branch is between the gate of the transistor and the gate driver, and the second branch is between the gate of the transistor and the gate driver, and wherein the electrical signal output by the inverter is related to a drain-source voltage of the transistor. The vehicle further includes a comparator for comparing the drain-source voltage to a threshold voltage and controlling an operation of the gate driver based on a comparison. In an embodiment in which the first branch includes a capacitor, wherein current flowing in the first branch during the first time period charges the capacitor and wherein discharge of the capacitor during the second time period diverts the current from the first branch to flow in the second branch during the second time period. The vehicle further includes a capacitor discharge path for discharging the capacitor during the second time period. The first branch includes at least one of a capacitor, a variable capacitor, a variable resistor, and a plurality of capacitors configured to be selectively included into the first branch.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

Figure 1:
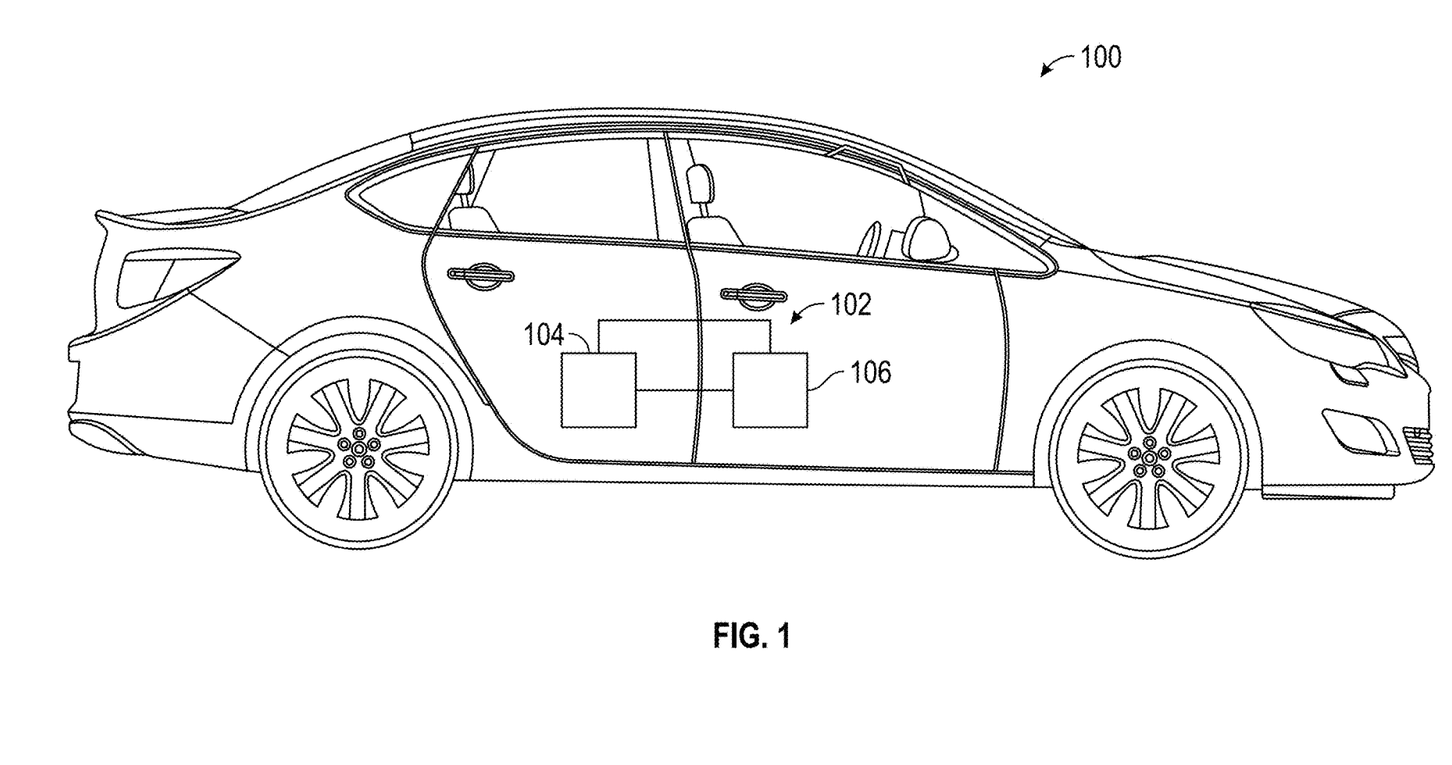
FIG. 1 shows a vehicle in accordance with an exemplary embodiment.

In accordance with an exemplary embodiment, FIG. 1 shows a vehicle 100. In various embodiments, the vehicle 100 is an electric vehicle. The vehicle 100 includes an electrical system 102 that includes a power source 104 and an electrical machine or electric motor 106. The power source 104 provides power to the electric motor 106 to produce rotary motion that can be used for motion of the vehicle 100. Although not shown, the vehicle 100 also include accessory loads, such as radio, air conditioning, power windows, etc., which can be powered by the power source 104.

Figure 2:
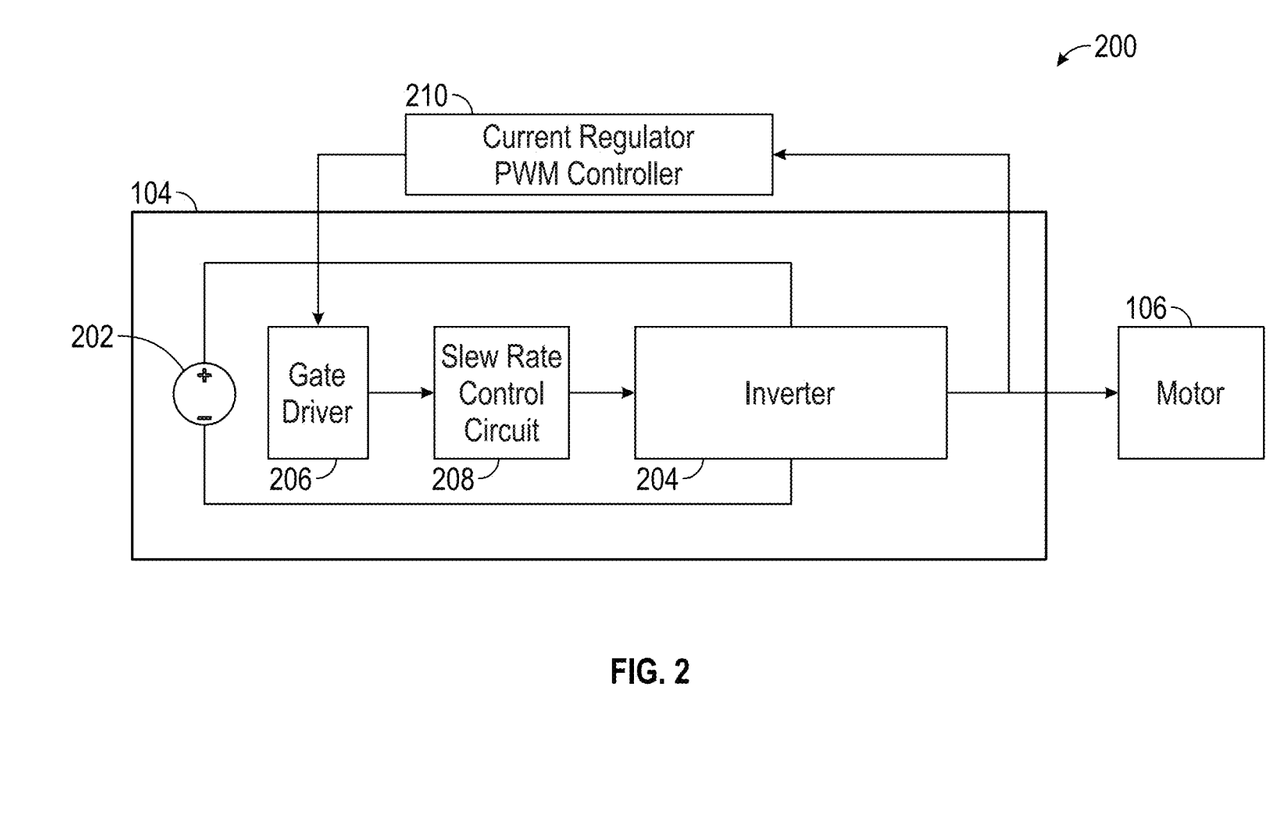
FIG. 2 shows a block diagram depicting details of the power source in an illustrative embodiment.

FIG. 2 shows a block diagram 200 depicting details of the power source 104 in an illustrative embodiment. The power source 104 includes a battery 202, an inverter 204, a gate driver 206, and a slew rate control circuit 208. The battery 202 provides a DC current to the inverter 204. The inverter 204 converts the DC current into an AC current which is sent to the electric motor 106 to power the motor. The inverter 204 can include one or more MOSFETS or transistors that are operated to convert the DC current into AC current. MOSFETs are known in the art and include source, gate, and drain electrodes. A voltage at the gate (i.e., a gate-source voltage $V_{GS}$) controls the voltage between the drain and the source (i.e., a drain-source voltage $V_{DS}$) and a current through the drain (i.e., a drain current $I_D$). The MOSFET outputs an electrical signal to the electric motor 106 to operate the electric motor. In various embodiments, the electrical signal is the drain-source voltage $V_{DS}$. In various embodiments, the gate driver 206 can provide a rising voltage pulse to turn on phase voltage to the electric motor 106 and a falling voltage pulse to turn off phase voltage to the electric motor. The slew rate control circuit 208 is located electrically between the gate driver 206 and the inverter 204. The slew rate control circuit 208 receives the gate voltage command (i.e., the control signal to the MOS-FET) from the gate driver 206 and modifies the shape of the gate voltage command before sending the modified gate voltage command to the inverter 204. In particular, the gate voltage command can be a falling or rising pulse and the slew rate control circuit 208 can control or modify a slew rate of the falling or rising pulse.

A current regulator 210 monitors the output of the inverter 204 (or the input to the electric motor 106) in order to provide overcurrent protection. Upon comparing the output of the inverter 204 to a threshold voltage, the current regulator 210 can provide a fault signal to the gate driver 206 to control its operation.

Figure 3:
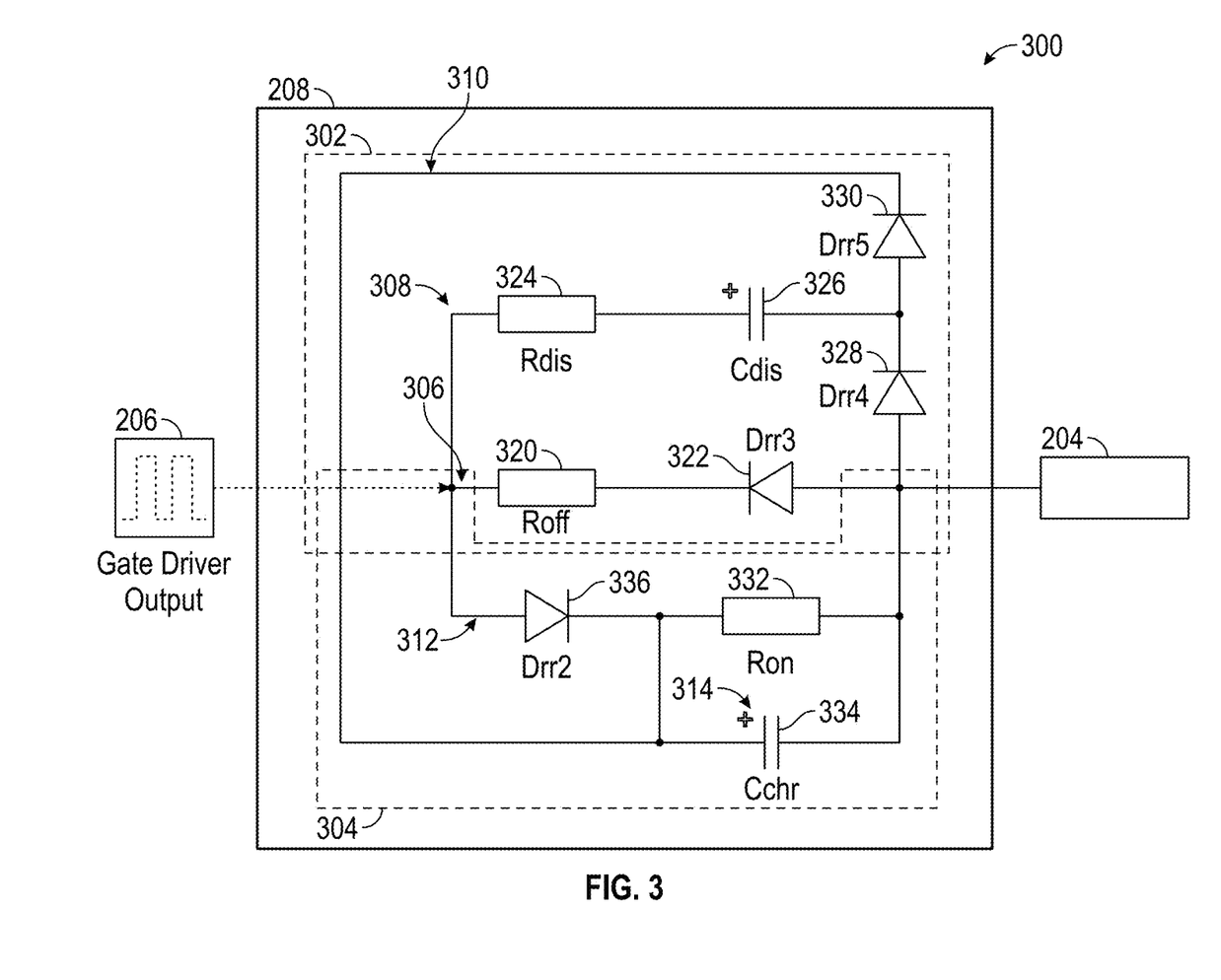
FIG. 3 shows a schematic diagram of the slew rate control circuit, in an embodiment.

FIG. 3 shows a schematic diagram 300 of the slew rate control circuit 208, in an embodiment. The slew rate control circuit 208 can be used for a switch of an inverter. It is noted that for an inverter having multiple switches (for example, a three-phase inverter includes six switches), multiple slew rate control circuits can be used, with each slew rate control circuit being associated with one of the multiple switches. The slew rate control circuit 208 includes a turn-off sub-circuit 302 that includes components for use during a turn-off of the switch in the inverter 204 and a turn-on sub-circuit 304 that includes components for use during a turn-on of one of the switches in the inverter.

The turn-off sub-circuit 302 includes a first resistive branch 306, a first control branch 308 and a capacitor discharge branch 310, which are arranged in parallel with each other between the gate driver 206 and one of the switches in inverter 204. The first resistive branch 306 includes a resistor 320 and a diode 322 that allows current to flow in one direction from the inverter 204 to the gate driver 206. Due to the direction or polarity of the diode 322, the first resistive branch 306 is active only during a turn-off event. The first control branch 308 is a variable impedance branch that includes a discharge resistor 324 and a discharge capacitor 326. A diode 328 separates the first control branch 308 from the first resistive branch 306 and is oriented to allow current to flow through the first control branch 308 in a direction from the inverter 204 to the gate driver 206 during a turn-off event, as well as to prevent current flowing toward the inverter 204 from flowing into the first resistive branch 306. The capacitor discharge branch 310 includes a diode 330 to allow one-way flow of current from the inverter 204 to the gate driver 206 as well as to dissipate energy in the discharge capacitor 326 during times of inactivity.

The turn-on sub-circuit 304 includes a second resistive branch 312 and a second control branch 314, which are in parallel with each other between the gate driver 206 and the inverter 204. The second resistive branch 312 includes resistor 332 and the second control branch 314 is a variable impedance branch that includes a charge capacitor 334. The charge capacitor 334 is in parallel with the resistor 332. Diode 336 causes the second resistive branch 312 and second control branch 314 to be active only during a turn-on event to allow current to flow from the gate driver 206 to the inverter 204.

Figure 4:
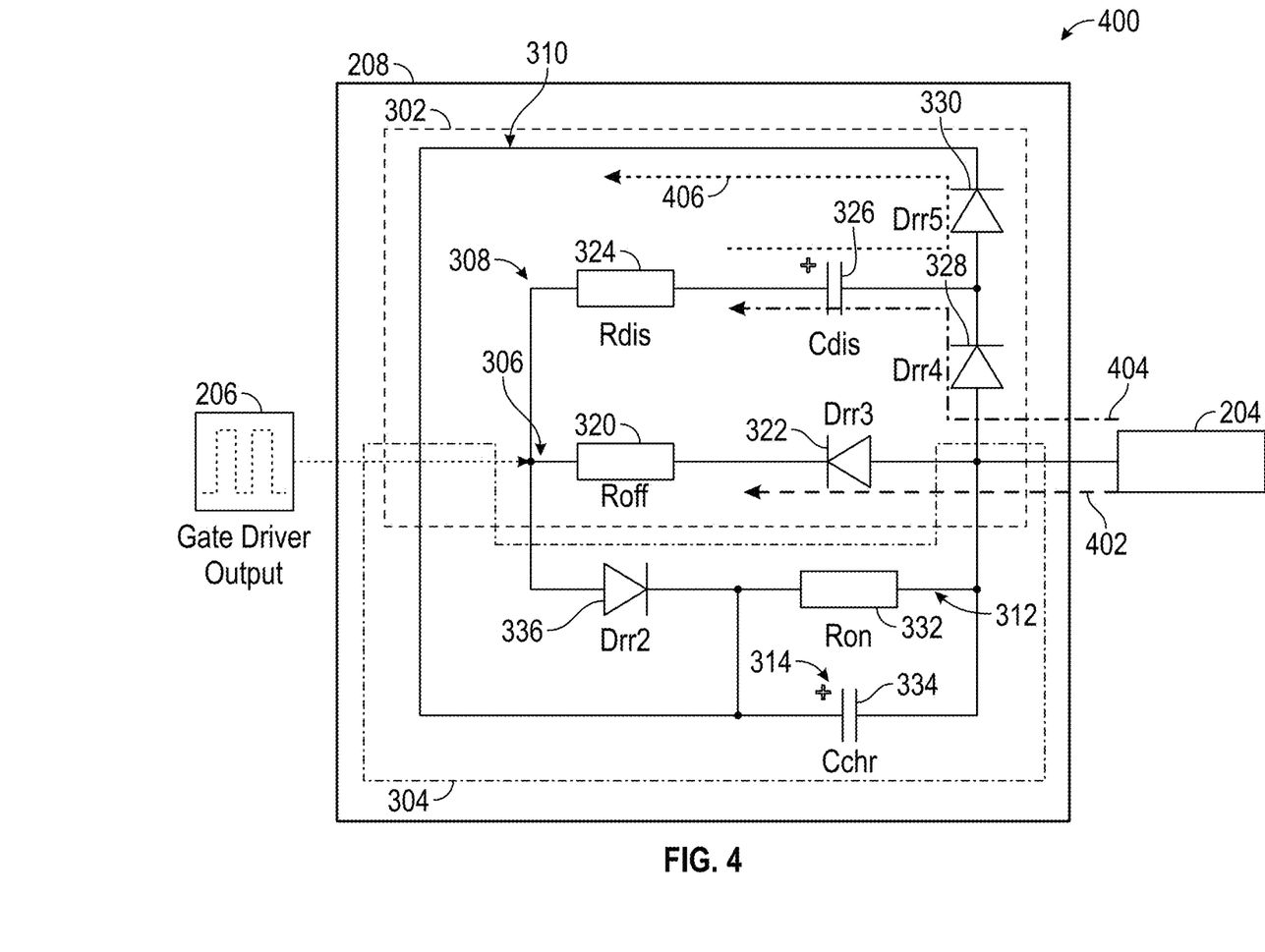
FIG. 4 shows various current paths that arise in the slew rate control circuit during a turn-off event.

FIG. 4 is a schematic diagram 400 that shows various current paths that arise in the slew rate control circuit 208 during a turn-off event. The current paths include a resistive discharge path 402, a slew rate control path 404 and a capacitor discharge path 406. The resistive discharge path 402 passes through the first resistive branch 306. The slew rate control path 404 passes through the first control branch 308. The capacitor discharge path 406 is a path that flows from the first control branch 308 and into the capacitor discharge branch 310.

When a turn-off event commences, the impedance on the discharge capacitor 326 is low. As a result, current is more likely to flow along the slew rate control path 404 through the first control branch 308, thereby making the slew rate control path 404 a dominant current flow path, while the resistive discharge path 402 is a secondary or subordinate current path. The discharge capacitor 326 charges over time, thereby increasing an impedance along the slew rate control path 404. Once the discharge capacitor 326 is charged, it diverts the current from the first control branch 308, causing more current to flow along the resistive discharge path 402, which thus takes over as the dominant current flow path. After the current from the inverter 204 flows through the resistive discharge path 402, the discharge capacitor 326 discharges along the capacitor discharge path 406 by discharging current back toward the inverter along the first control branch 308, through the diode 330 and toward the gate driver 206 along the capacitor discharge branch 310.

Figure 5:
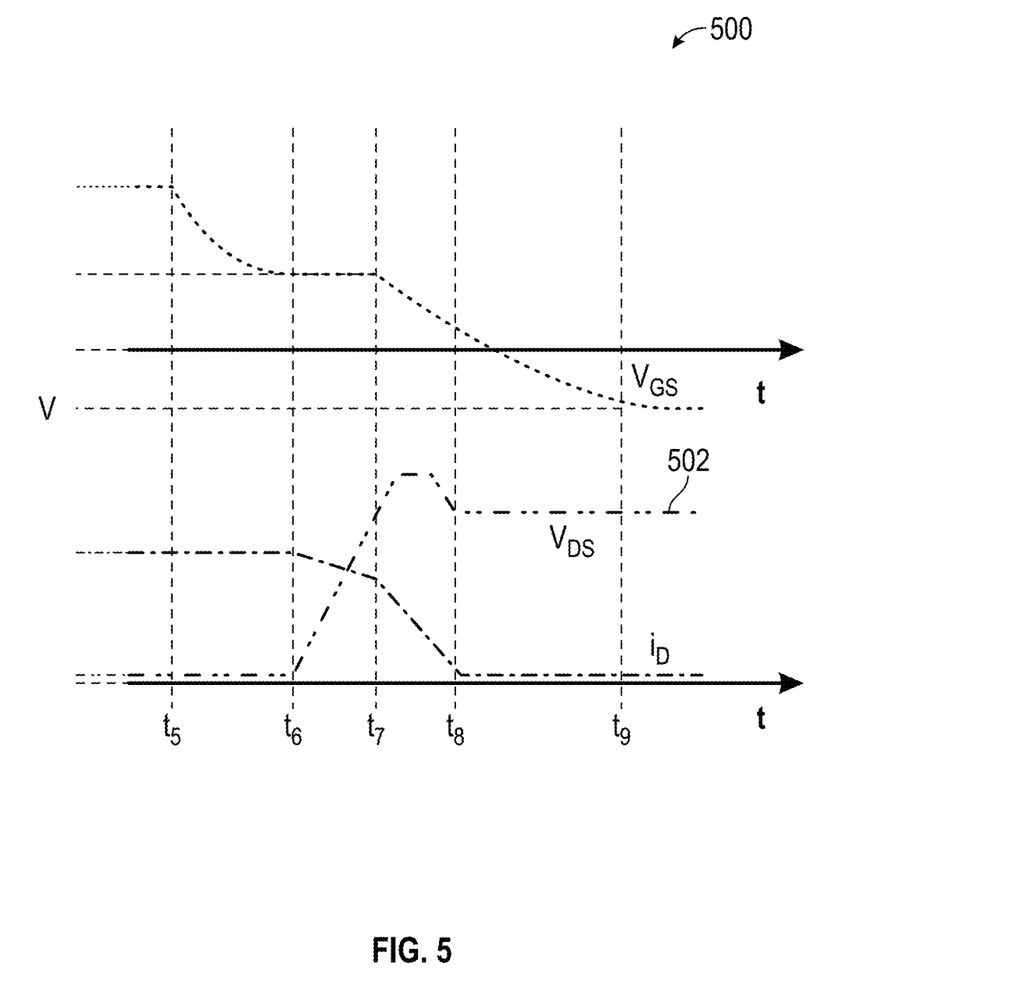
FIG. 5 is a timeline showing various electrical parameters of a MOSFET transistor of the inverter during a turn-off event.

FIG. 5 is a timeline 500 showing various electrical parameters of a MOSFET transistor of the inverter 204 during a turn-off event. The timeline 500 is divided into various time periods marked by times $t_5$, $t_6$, $t_7$, $t_8$ and $t_9$. At the beginning of the turn-off event (i.e., at $t_5$), the gate-source voltage $V_{GS}$ is at a high voltage, the drain current $I_D$ is at an operating current level, and the gate-drain voltage $V_{DS}$ is zero. From $t_5$ to $t_6$, the gate-source voltage ($V_{GS}$) falls from a high voltage to a mid-range stable voltage level, which it reaches at time $t_6$. Once $V_{GS}$ reaches the stable voltage level, the drain-source voltage ($V_{DS}$) begins to rise. The rise of $V_{DS}$ between $t_6$ and $t_7$ corresponds with the slew rate control path 404 being used as the dominant current path. The slew rate of $V_{DS}$ between $t_5$ and $t_6$ is controlled by the rate at which the discharge capacitor 326 charges, which is related to its capacitance. The drain current $I_D$ displays a slight decrease during this time between $t_6$ and $t_7$.

Time $t_7$ marks a time at which the discharge capacitor 326 becomes fully charged, allowing the resistive discharge path 402 to become a dominant path. Between $t_7$ and $t_8$, with discharge current from the inverter 204 occurring through the resistive discharge path 402, the drain current $I_D$ decreases at an increased speed (vs. its decrease during the time period from $t_6$ to $t_7$). The fall of the drain current $I_D$ causes the $V_{DS}$ to level off. The rate at which the $I_D$ decreases controls an amount of overshoot of the $V_{DS}$ with respect to its final voltage level 502 or operating voltage. The drain current $I_D$ falls to zero at time $t_8$. Between $t_8$ and $t_9$, the gate voltage $V_{GS}$ falls to a minimum voltage value.

Thus, current flows through a first branch (first control branch 308) during a first time period (from $t_6$ to $t_7$) to control the slew rate of $V_{DS}$ and flows through a second branch (first resistive branch 306) during a second time period (from $t_7$ to $t_8$) to control the slew rate of $I_D$, thereby controlling or reducing the overshoot of $V_{DS}$ during the second time period.

Figure 6:
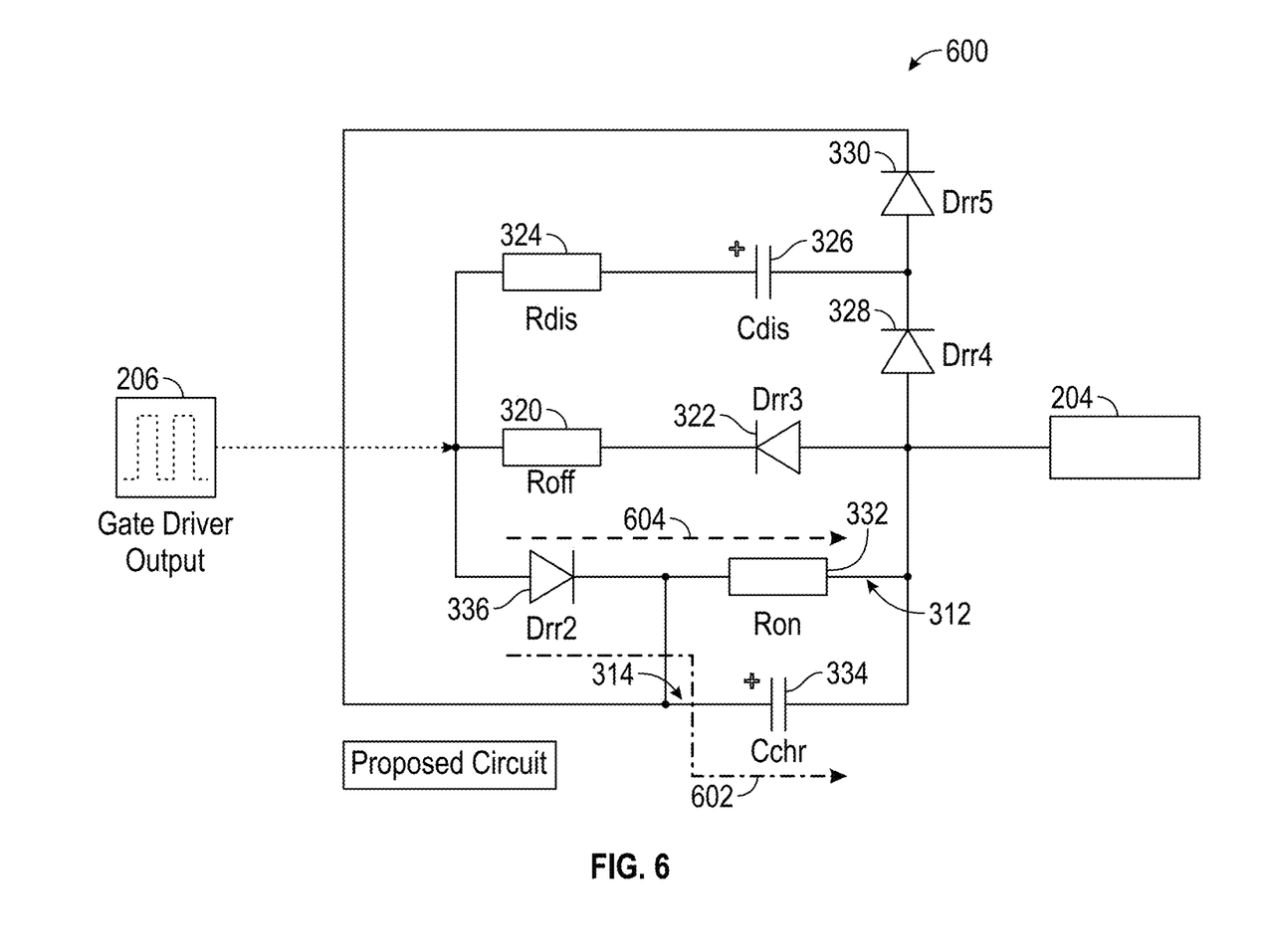
FIG. 6 shows various current paths that arise in the slew rate control circuit during a turn-on event.

FIG. 6 is a schematic diagram 600 that shows various current paths that arise in the slew rate control circuit 208 during a turn-on event. A first charge path 602 is shown allowing current to flow from the gate driver 206 to the inverter 204 through the diode 336 and the charge capacitor 334. A second charge path 604 is shown allowing current to flow from the gate driver 206 to the inverter 204 through the diode 336 and the resistor 332. The first charge path 602 is the dominant current path during a first time period of the turn-on event, during to the low charge on the capacitor. Once the capacitor has charged, the second charge path 604 becomes the dominant current path.

Figure 7:
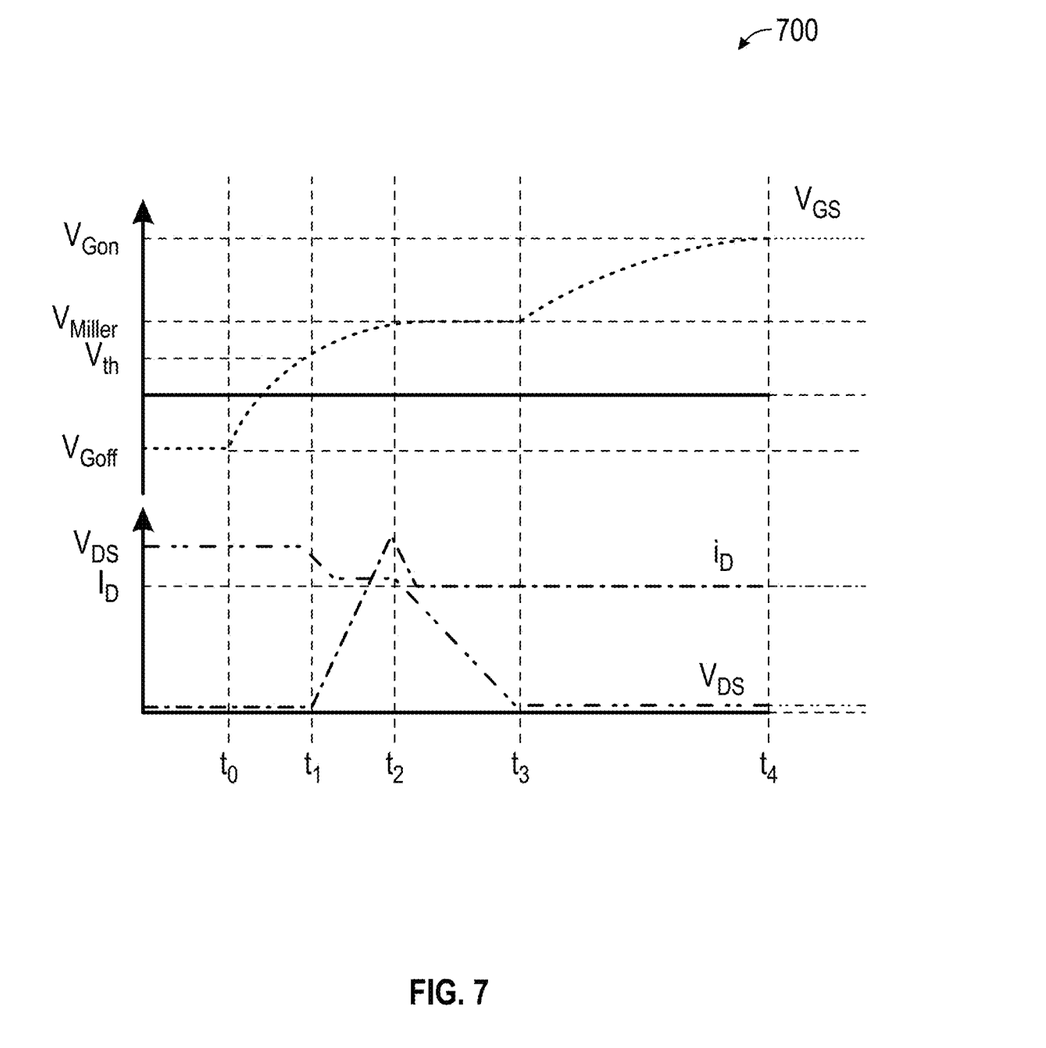
FIG. 7 is a timeline showing various electrical parameters of a transistor of the inverter during a turn-on event.

FIG. 7 is a timeline 700 showing various electrical parameters of a transistor of the inverter during a turn-on event. The timeline 700 is divided into various time periods marked by times $t_0$, $t_1$, $t_2$, $t_3$ and $t_4$. At the beginning of the turn-on event, the $V_{GS}$ is at a minimum voltage level, the drain current $I_D$ is zero and the $V_{DS}$ is at a positive operating voltage. Between $t_0$ and $t_1$, the gate-source voltage ($V_{GS}$) rises from a minimum voltage to a stable voltage level referred to as a Miller voltage $V_{Miller}$. At a time $t_1$ (between $t_0$ and $t_2$), $V_{GS}$ passes through a threshold voltage $V_{th}$ in an increasing direction, which triggers the drain current to increase. From $t_1$ to $t_2$, the drain current rises. During this same time period, the drain-source voltage $V_{DS}$ starts falling. The rise of $I_D$ occurs with charging current flowing along the first charge path 602 through the charge capacitor 334. From $t_2$ to $t_3$, $V_{DS}$ experiences a rapid decrease. At $t_2$, the capacitor is fully charged and the second charge path 604 becomes the dominant charge path. The fall of $V_{DS}$ from $t_2$ to $t_3$ is due to the flow of the current through the second charge path 604. The value of the capacitance of the charge capacitor 334 controls the slew rate of the current from $t_2$ to $t_3$. From $t_3$ to $t_4$, $V_{DS}$ has fallen to zero and the gate-source voltage $V_{GS}$ completes its rise to its high voltage state.

Thus, current flows through a first branch (first charge path 602) during a first time period (from $t_1$ to $t_2$) to control the slew rate of $I_D$ and flows through a second branch (second charge path 604) during a second time period (from $t_2$ to $t_3$) to control the slew rate of $V_{DS}$ and reduce the overshoot of $I_D$ during the second time period.

Figure 8:
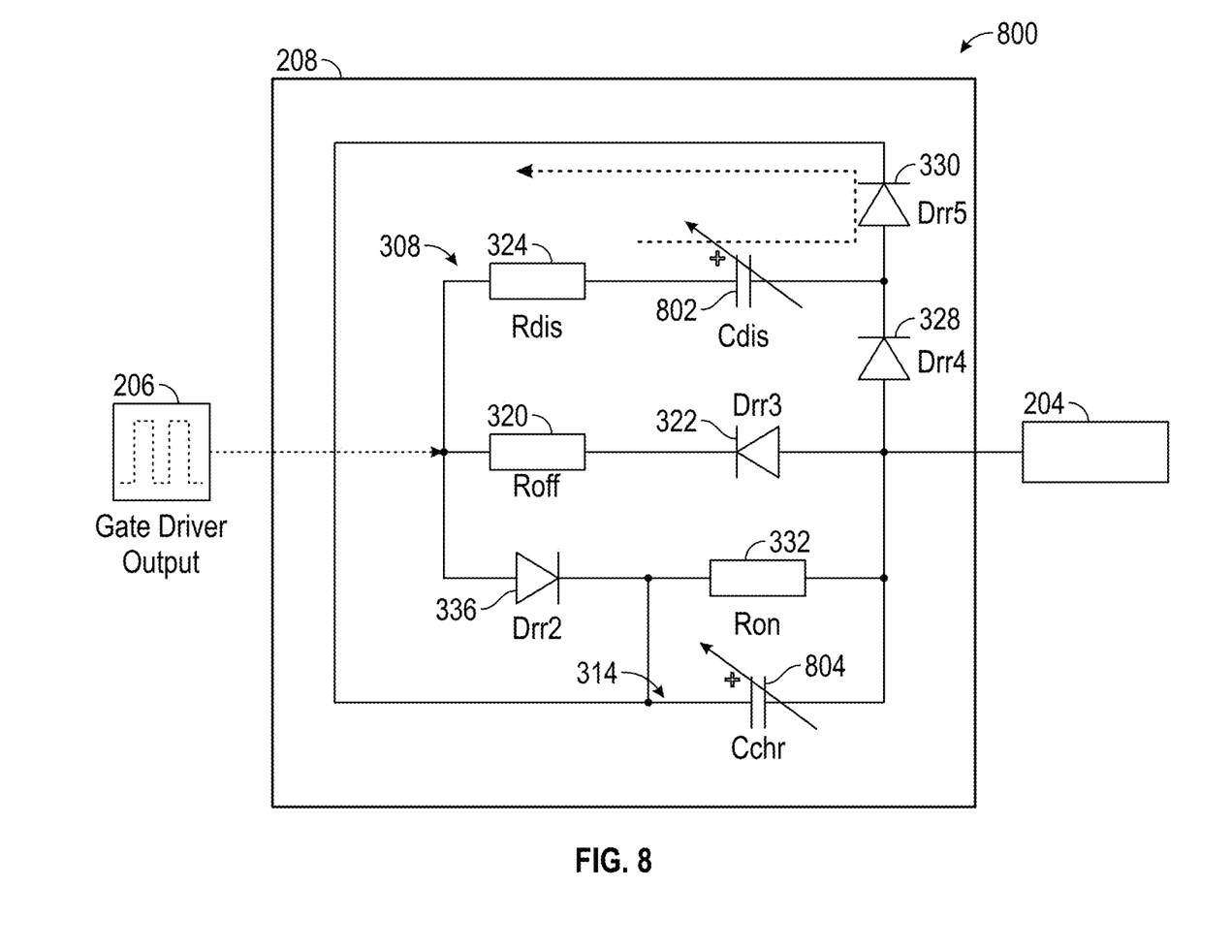
FIG. 8 shows a schematic diagram of the slew rate control circuit in an alternative embodiment.

FIG. 8 shows a schematic diagram 800 of the slew rate control circuit 208 in an alternative embodiment. A variable discharge capacitor 802 is included in the first control branch 308, taking the place of the discharge capacitor 326 shown in FIG. 2. Also, a variable charge capacitor 804 is included in the second control branch 314, taking the place of the charge capacitor 334 shown in FIG. 3. The capacitance of the variable discharge capacitor 802 can be adjusted to control the slew rate of $V_{DS}$ over the time period between $t_5$ and $t_6$. Also, the capacitance of the variable charge capacitor 804 can be adjusted to control the slew rate of $I_D$ over the time period between $t_1$ and $t_2$. Although not shown in FIG. 8, in various embodiments, the discharge resistor 324 and/or the resistor 332 can be replaced by variable resistors in order to control the related slew rates.

Figure 9:
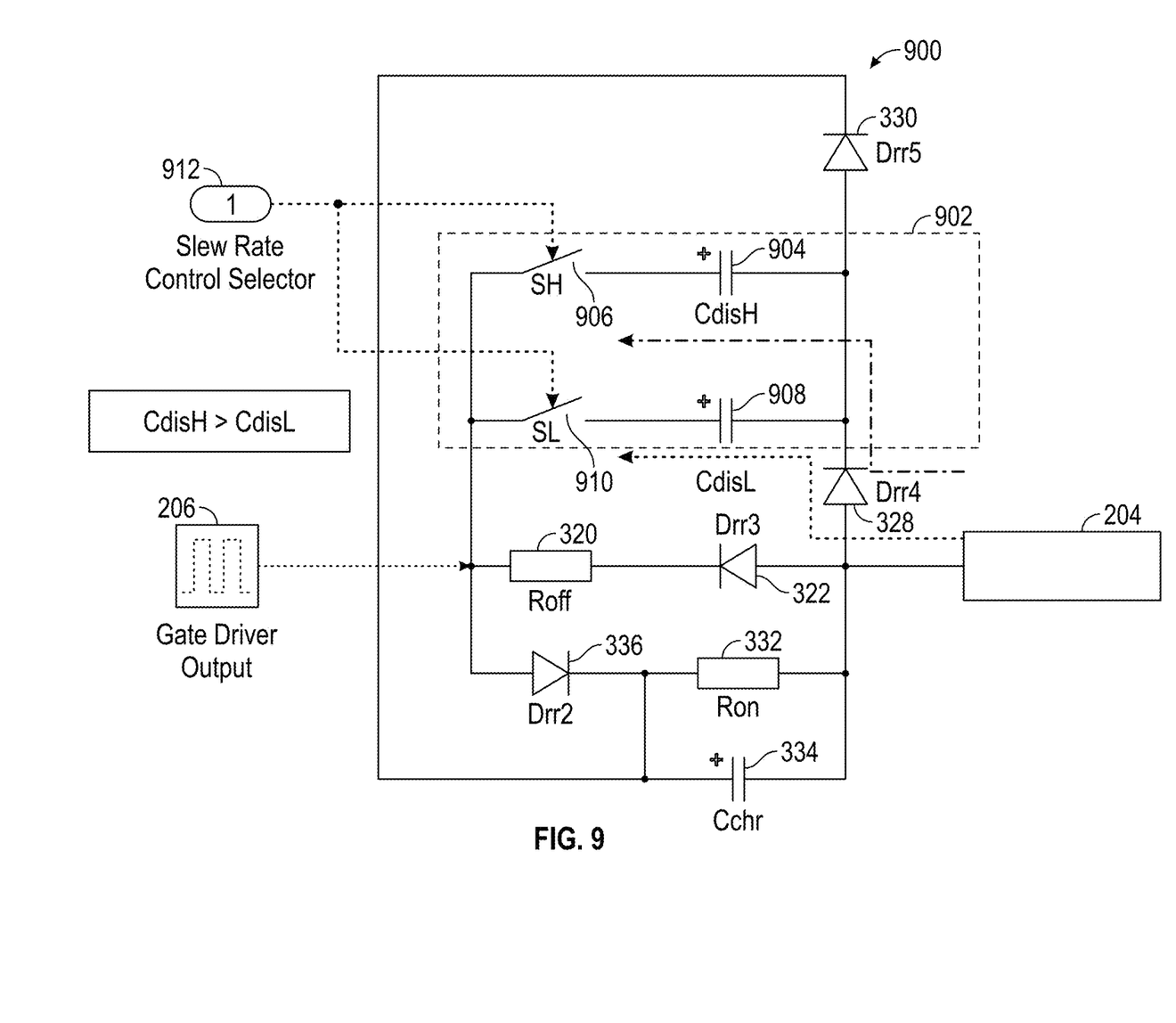
FIG. 9 shows a schematic diagram of the slew rate control circuit in another alternative embodiment.

FIG. 9 shows a schematic diagram 900 of the slew rate control circuit 208 in another alternative embodiment. A switchable control branch 902 takes the place of the first control branch 308 shown in FIG. 3. The switchable control branch 902 includes a first (high) capacitance branch and a second (low) capacitance branch. The first capacitance branch includes a first discharge capacitor 904 and a first switch 906. The second capacitance branch includes a second discharge capacitor 908 and a second switch 910. The first discharge capacitor 904 has a high capacitance. The second discharge capacitor 808 has a low capacitance.

A slew rate control selector 912 controls the configuration of the first switch 906 and the second switch 910 to select either the first discharge capacitor 904 or the second discharge capacitor 908. As a result, the slew rate of $V_{DS}$ during a turn-off event can be controlled or selected. Though not shown, additional discharge capacitors can be included in parallel with the first discharge capacitor 904 and the second discharge capacitor 908. The slew rate control selector 912 can control the configuration of related switches in order to select a desired capacitance using at least one of the plurality of capacitors and thus selecting a desired slew rate of $V_{DS}$. The capacitance can be selected based upon parameters such as vehicle torque, vehicle speed, or battery voltage operating point, to maximize efficiency.

Figure 10:
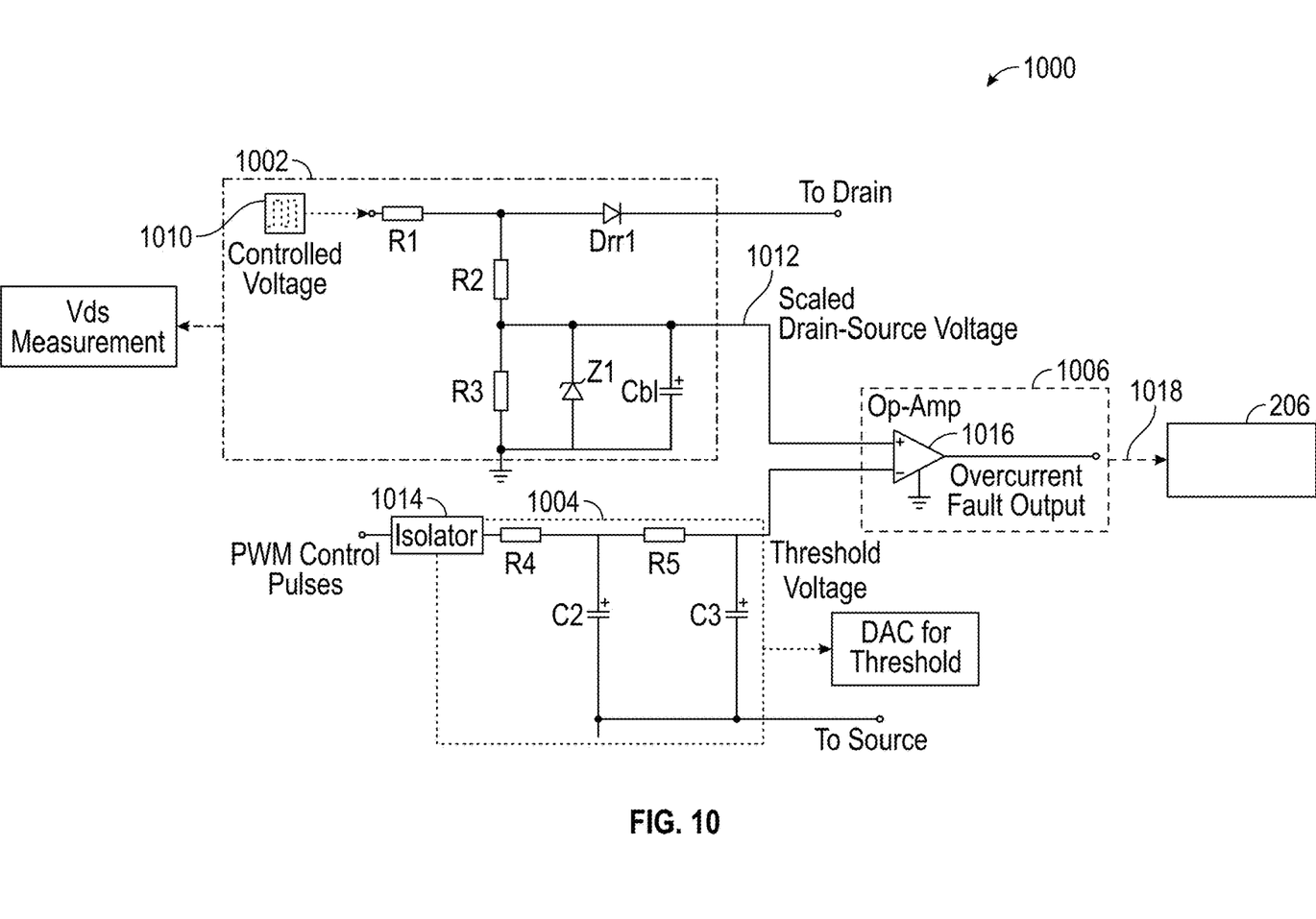
FIG. 10 is an overcurrent protection circuit that can be used to control the gate driver based on a drain-source voltage.

FIG. 10 is an overcurrent protection circuit 1000 that can be used to control the gate driver 206 based on a drain-source voltage. The overcurrent protection circuit 1000 includes a drain voltage control sub-circuit 1002, a pulse width modulated control sub-circuit 1004 and a comparator circuit 1006. The drain voltage control sub-circuit 1002 includes a controller voltage source 1010 which supplies the drain-source voltage at a transistor of the inverter 204. A scaled drain-source voltage 1012 is output to the comparator circuit 1006.

The pulse width modulated control sub-circuit 1004 is linked to the source electrode of the transistor and provides a pulse width modulated (PWM) control pulse with variable duty cycle applied using a digital isolator 1014. The PWM control pulse provides a threshold voltage to the comparator circuit 1006.

The comparator circuit 1006 includes a comparator 1016 which receives the scaled drain-source voltage 1012 at a first voltage input and the threshold voltage at a second voltage input. When the scaled drain-source voltage 1012 is greater than the voltage threshold $V_{th}$, an overcurrent fault signal 1018 is output from the comparator 1016. The overcurrent fault signal can be used to disable the gate driver 206 and can also be fed back to the pulse width modulated control sub-circuit 1004 via the digital isolator 1014. In various embodiments, the digital isolator 1014 can be located between the comparator 1016 and the gate driver 206.

Figure 11:
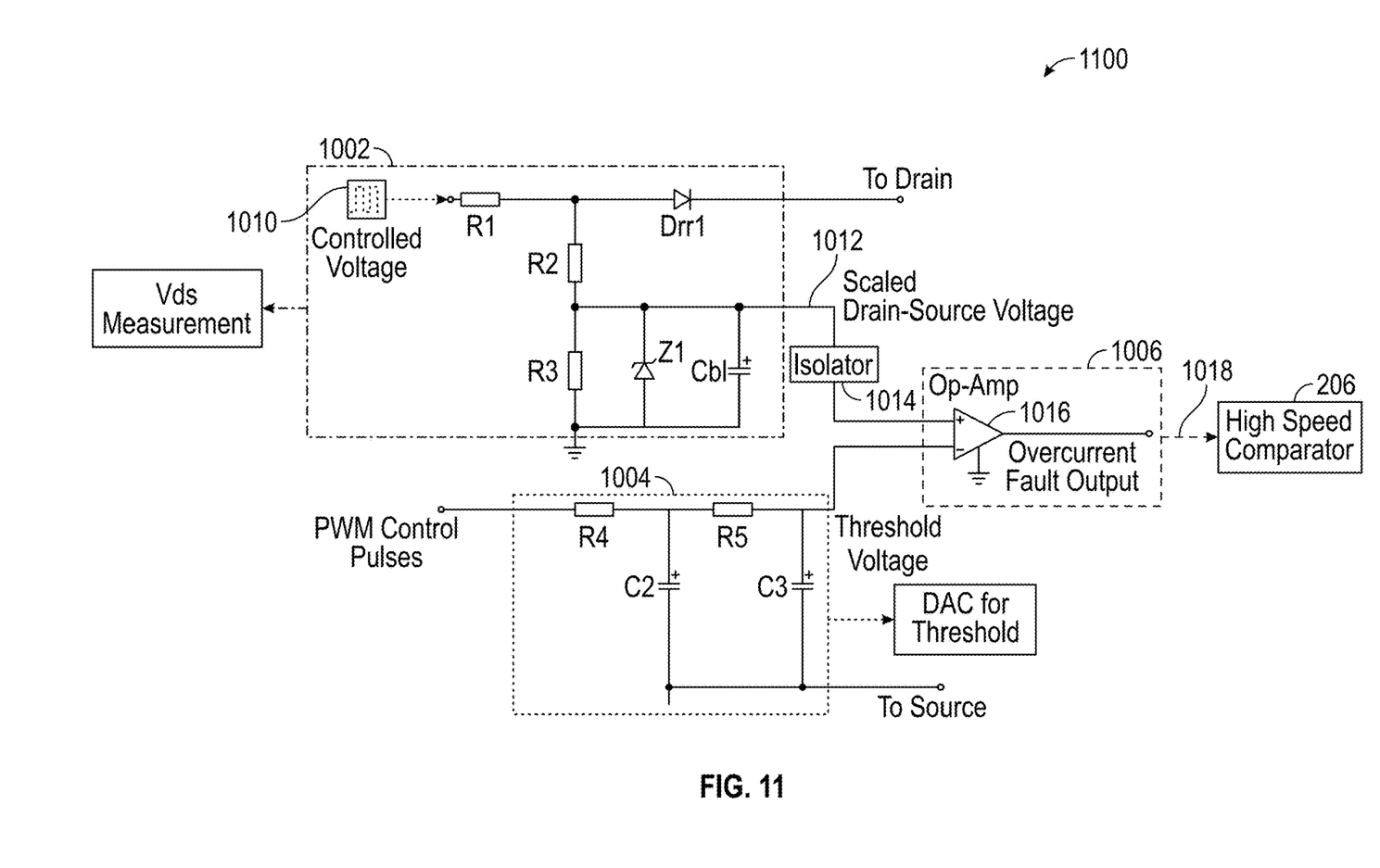
FIG. 11 shows the overcurrent protection system in an alternate embodiment.

FIG. 11 shows the overcurrent protection system in an alternate embodiment. The digital isolator 1014 is located between the drain voltage control sub-circuit 1002 and the comparator circuit 1006 or at the input to the comparator 1016.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of operating an electric motor of a vehicle, comprising:
   controlling a flow of a current between a gate driver and an inverter to control a slew rate of an electrical signal output by the inverter; and
   providing the electrical signal output by the inverter to the electric motor to operate the electric motor, wherein controlling the flow rate includes:
      flowing the current through a first branch from the inverter to the gate driver during a first time period, the first branch including a capacitor, wherein flowing the current in the first branch during the first time period charges the capacitor;
      flowing the current through a second branch from the inverter to the gate driver during a second time period to reduce a drain current to zero, the second branch parallel to the first branch, wherein the charged capacitor diverts the current from the first branch to flow in the second branch during the second time period; and
      discharging the charged capacitor through a third branch in parallel with the first branch and the second branch during a third time period in which the drain current is zero.

2. The method of claim 1, wherein the inverter includes a transistor having a gate, a source and a drain, further comprising controlling the flow of the current between the gate of the transistor and the gate driver, and wherein the electrical signal output by the inverter is related to a drain-source voltage of the transistor.

3. The method of claim 2, further comprising controlling an operation of the gate driver based on a comparison of the drain-source voltage to a threshold voltage.

4. The method of claim 1, further comprising controlling a rise in a drain-source current at the inverter during the first time period based on a charging rate of the capacitor.

5. The method of claim 1, wherein discharging the capacitor further comprises flowing current back toward the inverter along the first branch.

6. The method of claim 1, wherein the first branch includes at least one of: (i) a capacitor; (ii) a variable capacitor; (iii) a variable resistor; and (iv) a plurality of capacitors configured to be selectively included into the first branch.

7. The method of claim 6, wherein the first branch includes the plurality of capacitors, the method further comprising selecting the capacitance of the plurality of capacitors based on at least one of: (i) a vehicle torque; (ii) a vehicle speed; and (iii) a battery voltage operating point.

8. A slew rate control circuit for controlling an electric motor of a vehicle, comprising:
   a first branch between a gate driver and an inverter, wherein the inverter provides an electrical signal output to the electric motor, the first branch including a capacitor; and
   a second branch between the gate driver and the inverter in parallel with the first branch; and
   a third branch between the gate driver and the inverter in parallel with the first branch and the second branch;
   wherein the capacitor charges during a first time period during which current flows through the first branch from the inverter to the gate driver, diverts current to flow through the second branch to reduce a drain current to zero during a second time period in which the capacitor is fully charged, and discharges through the third branch during a third time period in which the drain current is zero, wherein the flow of the current controls a slew rate of the electrical signal output by the inverter to the electric motor.

9. The slew rate control circuit of claim 8, wherein the inverter includes a transistor having a gate, a source and a drain, the first branch is between the gate of the transistor and the gate driver, and the second branch is between the gate of the transistor and the gate driver, and wherein the electrical signal output by the inverter is related to a drain-source voltage of the transistor.

10. The slew rate control circuit of claim 9, further comprising a comparator for comparing the drain-source voltage to a threshold voltage and controlling an operation of the gate driver based on a comparison.

11. The slew rate control circuit of claim 8, wherein a charging rate of the capacitor controls a rise in a drain-source current at the inverter during the first time period.

12. The slew rate control circuit of claim 8, wherein the capacitor discharges by flowing current back toward the inverter along the first branch.

13. The slew rate control circuit of claim 8, wherein the first branch includes at least one of: (i) a capacitor; (ii) a variable capacitor; (iii) a variable resistor; and (iv) a plurality of capacitors configured to be selectively included into the first branch.

14. The slew rate control circuit of claim 8, wherein the electrical signal output by the inverter is one of a rising voltage pulse and a falling voltage pulse.

15. A vehicle, comprising:
a gate driver
an inverter; and
a slew rate control circuit between the gate driver and the inverter, the slew rate control circuit comprising:
a first branch between the gate driver and the inverter, wherein the inverter provides an electrical signal output to an electric motor of the vehicle, the first branch including a capacitor; and
a second branch between the gate driver and the inverter in parallel with the first branch; and
a third branch between the gate driver and the inverter in parallel with the first branch and the second branch;
wherein the capacitor charges during a first time period during which current flows through the first branch from the inverter to the gate driver, diverts current to flow through the second branch to reduce a drain current to zero during a second time period in which the capacitor is fully charged, and discharges through the third branch during a third time period in which the drain current is zero, wherein the flow of the current controls a slew rate of the electrical signal output by the inverter to the electric motor.

16. The vehicle of claim 15, wherein the inverter includes a transistor having a gate, a source and a drain, the first branch is between the gate of the transistor and the gate driver, and the second branch is between the gate of the transistor and the gate driver, and wherein the electrical signal output by the inverter is related to a drain-source voltage of the transistor.

17. The vehicle of claim 16, further comprising a comparator for comparing the drain-source voltage to a threshold voltage and controlling an operation of the gate driver based on a comparison.

18. The vehicle of claim 15, wherein a charging rate of the capacitor controls a rise in a drain-source current at the inverter during the first time period.

19. The vehicle of claim 18, wherein the capacitor discharges by flowing current back toward the inverter along the first branch.

20. The vehicle of claim 15, wherein the first branch includes at least one of: (i) a capacitor; (ii) a variable capacitor; (iii) a variable resistor; and (iv) a plurality of capacitors configured to be selectively included into the first branch.

* * * * *